(12) United States Patent
Takahashi et al.

(10) Patent No.: US 8,071,883 B2
(45) Date of Patent: Dec. 6, 2011

(54) FLEX-RIGID WIRING BOARD INCLUDING FLEXIBLE SUBSTRATE AND NON-FLEXIBLE SUBSTRATE AND METHOD OF MANUFACTURING THE SAME

(75) Inventors: Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 961 days.

(21) Appl. No.: 11/876,413

(22) Filed: Oct. 22, 2007

(65) Prior Publication Data
US 2008/0093118 A1 Apr. 24, 2008

Related U.S. Application Data

(60) Provisional application No. 60/853,423, filed on Oct. 23, 2006.

(51) Int. Cl.
*H05K 1/00* (2006.01)
(52) U.S. Cl. .................. 174/254; 174/264; 361/749
(58) Field of Classification Search .............. 174/254; 361/749–751
See application file for complete search history.

(56) References Cited

U.S. PATENT DOCUMENTS

| | | | |
|---|---|---|---|
| 3,471,348 A | 10/1969 | Shaheen et al. | |
| 4,099,038 A | 7/1978 | Purdy | |
| 4,687,695 A | 8/1987 | Hamby | |
| 4,715,928 A | 12/1987 | Hamby | |
| 6,384,339 B1 | 5/2002 | Neuman | |
| 7,210,942 B2 | 5/2007 | Uchida et al. | |
| 7,258,549 B2 * | 8/2007 | Asahi et al. | 439/66 |
| 7,423,219 B2 * | 9/2008 | Kawaguchi et al. | 174/254 |
| 7,759,582 B2 * | 7/2010 | Takahashi et al. | 174/264 |
| 2001/0010303 A1 | 8/2001 | Caron et al. | |
| 2006/0169485 A1 | 8/2006 | Kawaguchi et al. | |
| 2006/0281343 A1 | 12/2006 | Uchida et al. | |
| 2007/0012475 A1 | 1/2007 | Kawaguchi et al. | |
| 2007/0126123 A1 | 6/2007 | Sawachi | |
| 2007/0281505 A1 | 12/2007 | Kobayashi et al. | |
| 2009/0014205 A1 | 1/2009 | Kobayashi et al. | |

FOREIGN PATENT DOCUMENTS

| | | |
|---|---|---|
| CN | 1806474 A | 7/2006 |
| DE | 42 08 610 C1 | 5/1993 |
| EP | 1 566 993 A1 | 8/2005 |
| JP | 63-293991 | 11/1988 |
| JP | 3-246986 | 11/1991 |

(Continued)

OTHER PUBLICATIONS

U.S. Appl. No. 11/927,144, filed Oct. 29, 2007, Takahashi, et al.

*Primary Examiner* — Jeremy Norris
(74) *Attorney, Agent, or Firm* — Oblon, Spivak, McClelland, Maier & Neustadt, L.L.P.

(57) ABSTRACT

A flex-rigid wiring board includes a flexible board including a flexible substrate and a conductor pattern formed over the flexible substrate, a non-flexible substrate disposed adjacent to the flexible board, an insulating layer covering the flexible board and the non-flexible substrate and exposing one or more portions of the flexible board, a conductor pattern formed on the insulating layer, and a plating layer connecting the conductor pattern of the flexible board and the conductor pattern on the insulating layer.

24 Claims, 17 Drawing Sheets

FOREIGN PATENT DOCUMENTS

| | | |
|---|---|---|
| JP | 5-90756 | 4/1993 |
| JP | 5-315758 | 11/1993 |
| JP | 06-216537 | 8/1994 |
| JP | 7-94835 | 4/1995 |
| JP | 2003-152309 | 5/2003 |
| JP | 2005-311244 | 11/2005 |
| JP | 2005-322878 | 11/2005 |
| JP | 2006-73819 | 3/2006 |
| JP | 2006-100703 | 4/2006 |
| JP | 2006-100704 | 4/2006 |
| JP | 2006-128360 | 5/2006 |
| JP | 2006-140213 | 6/2006 |
| JP | 2006-196800 | 7/2006 |
| JP | 2006-294666 | 10/2006 |
| JP | 4021472 B1 | 10/2007 |
| JP | 4024846 B1 | 10/2007 |
| TW | 478306 | 3/2002 |
| WO | WO 93/11652 | 6/1993 |
| WO | WO 2004/093508 A1 | 10/2004 |
| WO | WO 2004/098252 A1 | 11/2004 |

* cited by examiner

FIG. 5F" 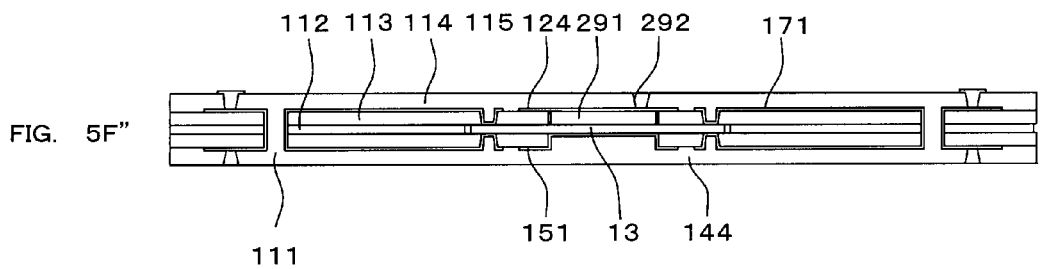
FIG. 5G" 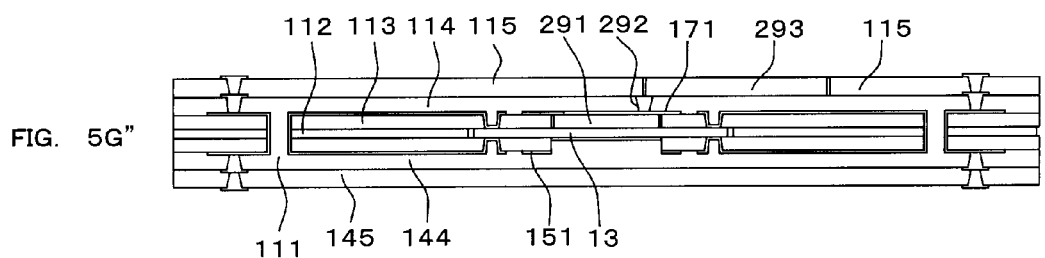
FIG. 5K" 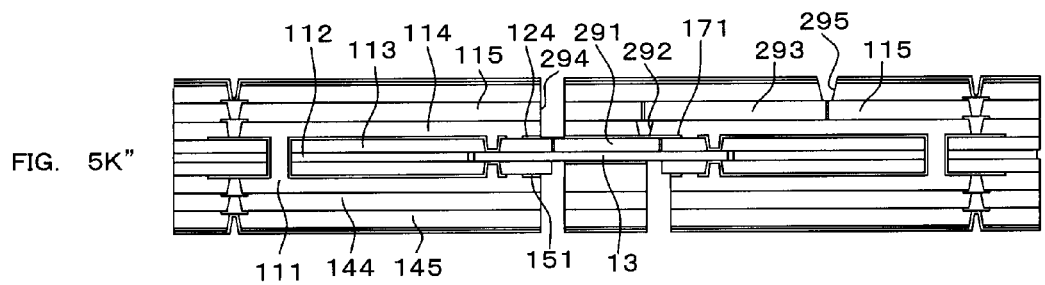
FIG. 5L" 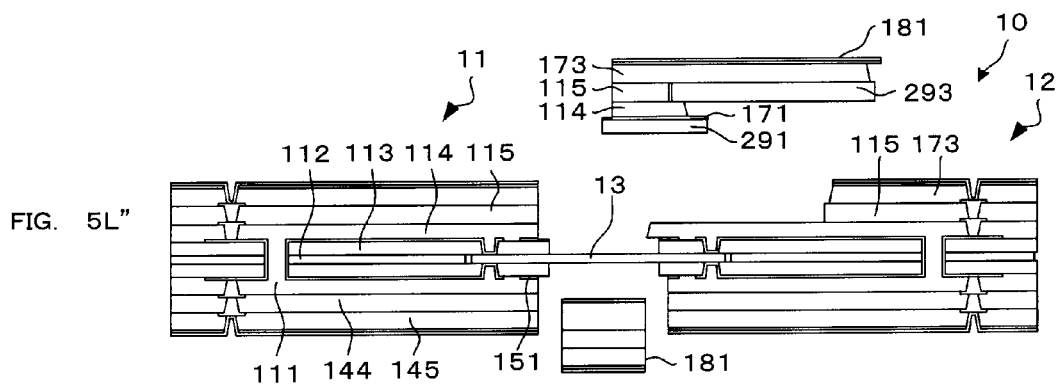

FLEX-RIGID WIRING BOARD INCLUDING FLEXIBLE SUBSTRATE AND NON-FLEXIBLE SUBSTRATE AND METHOD OF MANUFACTURING THE SAME

CROSS-REFERENCE TO RELATED APPLICATIONS

The present application claims the benefits of priority to U.S. application No. 60/853,423, filed Oct. 23, 2006. The contents of that application are incorporated herein by reference in their entirety.

BACKGROUND OF THE INVENTION

1. Field of the Invention

The present invention relates to a wiring board including a flexible portion and a method of manufacturing the same.

2. Discussion of the Background

Flex-rigid wiring boards each including a rigid portion and a flexible portion are described in, for example, Japanese Unexamined Patent Application Publication Nos. 2006-140213 and 2006-100703, and International Publication No. WO2004/093508.

A flex-rigid wiring board described in Japanese Unexamined Patent Application Publication No. 2006-140213 includes a core board provided as a rigid portion, a flexible board disposed adjacent to the core board in the horizontal direction, a flexible adhesive layer laminated on the core board and the flexible board, a wiring pattern formed on the flexible adhesive layer disposed in the rigid portion, and blind vias and/or through holes for connecting wiring patterns formed in respective layers. In this constitution, the flexible adhesive layer is laminated on the flexible board.

Japanese Unexamined Patent Application Publication No. 2006-100703 describes a method of manufacturing a flex-rigid wiring board. In the method, first, a rigid board having a vertical wiring portion formed in a connection region thereof and a flexible board having a connection terminal formed at an end thereof are separately formed. Then, the connection region of the rigid board is cut out to a depth larger than the thickness of the flexible board to form a step. Next, the connection terminal of the flexible board is connected to the vertical wiring portion of the step.

A flex-rigid wiring board disclosed in WO2004/093508 includes a rigid board and a flexible board which are bonded together with an insulating adhesive to form a unified body. Furthermore, connection electrode pads of the rigid board and the flexible board are electrically and physically connected through bulk conductors provided through the insulating adhesive. In the flex-rigid wiring board with the above-described constitution, the flexible board is disposed on one of the sides of the rigid substrate, and laser is applied to the flexible board side to form vias for plating connection.

The contents of the above mentioned publications are incorporated herein by reference in their entirety.

SUMMARY OF THE INVENTION

According to one aspect of the present invention, a flex-rigid wiring board includes a flexible board including a flexible substrate and a conductor pattern formed over the flexible substrate, a non-flexible substrate disposed adjacent to the flexible board, an insulating layer covering the flexible board and the non-flexible substrate and exposing one or more portions of the flexible board, a conductor pattern formed on the insulating layer, and a plating layer connecting the conductor pattern of the flexible board and the conductor pattern on the insulating layer.

According to another aspect of the present invention, a flex-rigid wiring board includes a flexible board including a flexible substrate and a conductor pattern formed over the flexible substrate, a non-flexible substrate disposed adjacent to the flexible board, an insulating layer covering the flexible board and the non-flexible substrate and exposing one or more portions of the flexible board, a conductor pattern formed on the insulating layer, and a via formed in the insulating layer and connecting the conductor pattern on the insulating layer and the conductor pattern of the flexible board.

According to yet another aspect of the present invention, a flex-rigid wiring board includes a flexible board including a flexible substrate and a conductor pattern formed over the flexible substrate, a non-flexible substrate disposed adjacent to the flexible board, an insulating layer covering the flexible board and the non-flexible substrate and exposing one or more portions of the flexible board, a conductor pattern formed on the insulating layer, and a via formed in the insulating layer and connecting the conductor pattern on the insulating layer and the conductor pattern of the flexible board. The flexible board further includes a protective layer covering the conductor pattern of the flexible board, and the via formed in the insulating layer includes a plating layer.

According to still another aspect of the present invention, a method of manufacturing a flex-rigid wiring board includes disposing a flexible board including a flexible substrate and a conductor pattern formed over the flexible substrate and a non-flexible substrate adjacent to each other, covering a boundary between the flexible board and the non-flexible substrate with an insulating layer, providing a conductor pattern on the insulating layer, forming a via hole opening which passes through the insulating layer and reaches the conductor pattern of the flexible board, and plating the via hole opening to form a via connecting the conductor pattern of the flexible board and the conductor pattern on the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5A', 5G', 5K' and 5L' are views illustrating modified steps of the method of manufacturing a flex-rigid wiring board shown in FIGS. 5A to 5L;

FIGS. 5F", 5G" 5K" and 5L" are views illustrating other modified steps of the method of manufacturing a flex-rigid wiring board shown in FIGS. 5A to 5L;

DESCRIPTION OF THE EMBODIMENTS

Figure 1A:
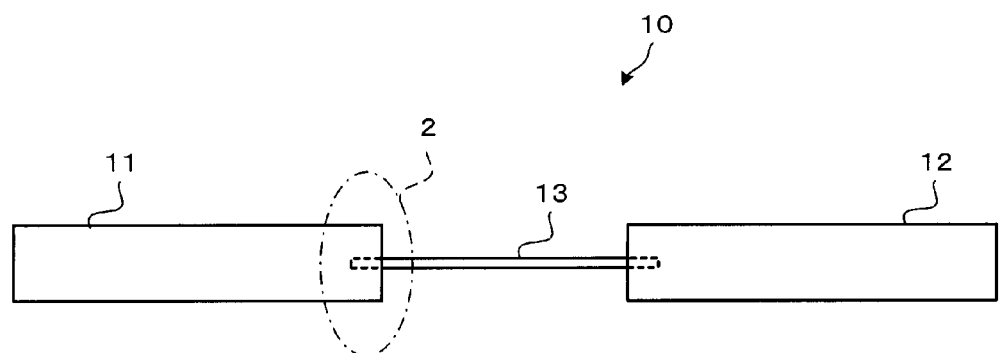
FIGS. 1A and 1B are a side view and a plan view of a flex-rigid wiring board according to an embodiment of the present invention.

The embodiments will now be described with reference to the accompanying drawings, wherein like reference numerals designate corresponding or identical elements throughout the various drawings.

A flex-rigid wiring board 10 according to an embodiment of the present invention will be described.

Figure 1B:
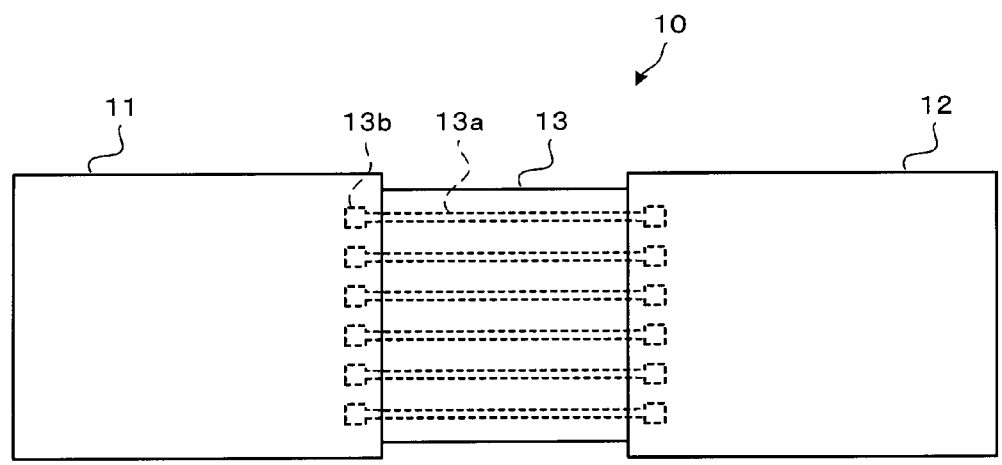

As shown in FIGS. 1A and 1B, the flex-rigid wiring board 10 according to this embodiment includes a first rigid board (rigid board) 11, a second rigid board 12, and a flexible board 13 connecting the rigid boards 11, 12 to each other.

On each of the first and second rigid boards 11, 12, any desired circuit pattern is formed. For example, an electronic component such as a semiconductor chip may be connected to each board.

On the flexible board 13, stripe-shaped wiring (13a) is formed for connecting the circuit patterns on the first and second rigid boards 11, 12. The wiring (13a) connects the circuit patterns on the rigid boards 11, 12 to each other.

Figure 2:
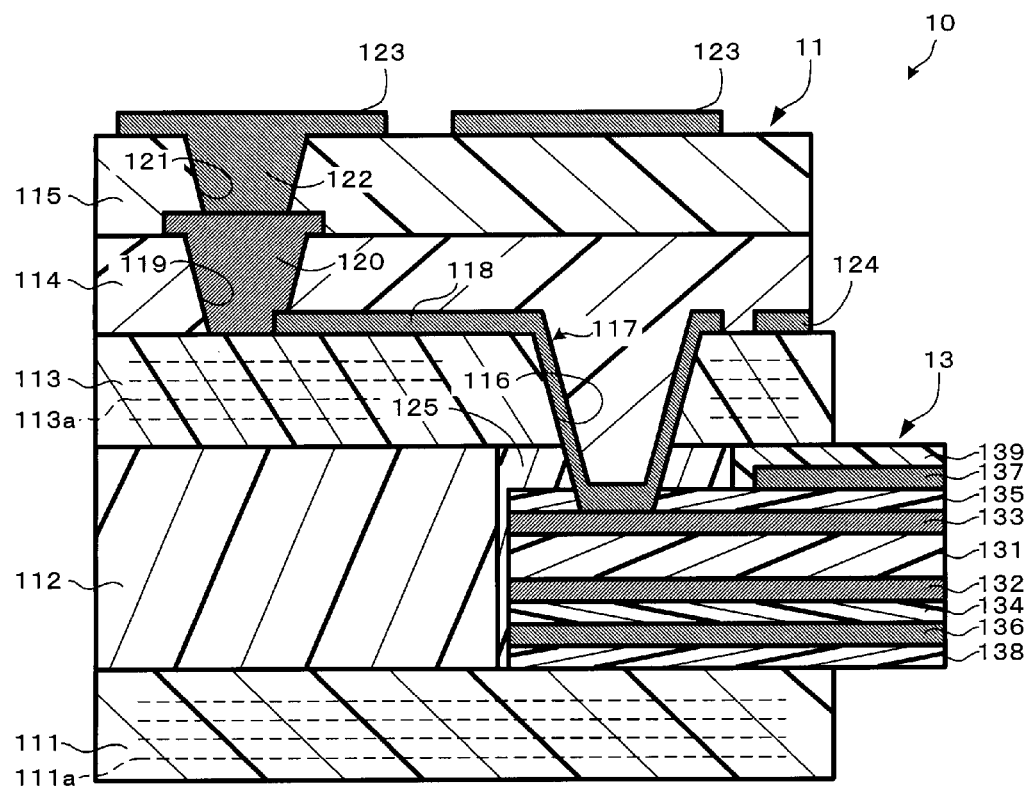
FIG. 2 is a partially enlarged view of FIG. 1A.

Next, with respect to the structure of the junction portions between the rigid boards 11, 12 and the flexible board 13, the junction portion between the rigid board 11 and the flexible board 13 will be described referring to an example as shown in FIG. 2. FIG. 2 is an enlarged sectional view of an area denoted by reference numeral 2 in FIG. 1A.

As shown in the drawing, the flexible board 13 has a structure in which a substrate 131, conductor layers 132, 133, insulating films 134, 135, shield layers 136, 137, and cover lays 138, 139 are laminated. One or more of the insulating films 134, 135, shield layers 136, 137, and cover lays 138, 139 may constitute a protective layer.

The substrate 131 is composed of an insulating flexible sheet, for example, a polyimide sheet having a thickness of 20 to 50 µm, preferably about 30 µm.

The conductor layers 132, 133 are formed on the front and back surfaces of the substrate 131, respectively, and each have a wiring stripe pattern (13a). For example, each of the conductor layers 132, 133 has a copper pattern having a thickness of about 5 to 15 µm.

The insulating films 134, 135 may be composed of a polyimide film having a thickness of about 5 to 15 µm and insulate the conductor layers 132, 133, respectively, from the outside.

The shield layers 136, 137 (also referred as electromagnetic shield layers) may be conductive layers each including a silver paste cured film and shield the conductor layers 132, 133 from external electromagnetic noise and shield the emission of electromagnetic noise toward the outside.

The cover lays 138, 139 include insulating films of polyimide or the like having a thickness of about 5 to 15 µm and insulate and protect the whole flexible board 13 from the outside.

On the other hand, the rigid board 11 includes a laminate of a first insulating layer 111, a non-flexible substrate 112, a second insulating layer 113, and first and second upper insulating layers 114, 115.

The non-flexible substrate 112 gives rigidity to the rigid board 11 and is composed of a non-flexible insulating material such as a glass epoxy resin. The non-flexible substrate 112 is disposed with a space from the flexible board 13 in a horizontal direction. The non-flexible substrate 112 has substantially the same thickness as the flexible board 13, for example, 50 to 150 µm, preferably about 100 µm.

Each of the first and second insulating layers 111, 113 may be formed by curing prepreg, for example, glass clothes (111a, 113a) impregnated with resin 125, and has a thickness of 50 to 100 µm, preferably about 50 µm.

The prepreg preferably contains a resin having a low flow characteristic. Such prepreg can be prepared by impregnating a glass cloth with an epoxy resin and then thermally curing the resin to facilitate the progress of curing in advance.

The prepreg can also be formed by impregnating a glass cloth with a resin with high viscosity, impregnating a glass cloth with a resin containing an inorganic filler, e.g., a silica filler, or impregnating a glass cloth with a decreased amount of resin.

The first and second insulating layers 111, 113 cover both the front and the back surfaces of the non-flexible substrate 112 and the flexible board 13 to partially expose the flexible board 13. The resin of the first and second insulating layers 111, 113 is overlapped with the resin of the cover lays 138, 139 on the surfaces of the flexible board 13.

The non-flexible substrate 112 and the first and second insulating layers 111, 113 constitute the core of the rigid board 11 to support the rigid board 11 and hold one of the ends of the flexible board 13 to support and fix the flexible board 13.

The spaces formed by the non-flexible substrate 112, the flexible board 13, and the first and second insulating layers 111, 113 are filled with a resin 125. The resin 125 seeps from the low-flow prepreg constituting the first and second insulating layer 111, 113, for example, during manufacture. The resin 125 is cured integrally with the first and second insulating layers 111, 113.

Furthermore, in the second insulating layer 113, via openings (via hole or contact hole) 116 are formed in a portion opposing connection pads (13b) of the wiring 133 of the flexible board 13.

In the flexible board 13, the shield layer 137 and the cover lay 139 of the flexible board 13 are removed from a portion opposing the vias 116 (a portion in which the connection pads (13b) of the conductor layer (13a) are formed). The via openings 116 pass through the insulating film 135 of the flexible board 13 to expose the connection pads (13b) of the conductor layer 133.

In addition, a conductor layer 117 (may also be referred as vias, via hole conductor structure, or via contact) is formed on the inner surface of each of the via openings 116 by copper plating or the like. The conductor layers or vias 117 are connected to the connection pads (13b) of the conductor layer 113 of the flexible board 13 by plating. The via openings 116 are filled with a resin.

Furthermore, an extraction pattern 118 is formed on the second insulating layer 113 to be connected to the conductor layers or vias 117. The extraction pattern 118 includes a copper plating layer.

Furthermore, a copper pattern 124 insulated from other components is formed at an end of the second insulating layer 113, i.e., at a position beyond the boundary between the flexible board 13 and the non-flexible substrate 112. Therefore, heat generated in the rigid board 11 is effectively radiated.

The first upper insulating layer 114 is laminated on the second insulating layer 113. The first upper insulating layer 114 may be formed by curing a material containing an inorganic material, for example, prepreg prepared by impregnating a glass cloth with a resin. This improves the resistance to dropping impact.

In the process of manufacturing the flex-rigid wiring board, the via openings 116 are filled with the resin seeping from the prepreg.

Furthermore, the second upper insulating layer 115 is disposed on the first upper insulating layer 114. The second upper insulating layer 115 may also be formed by curing prepreg including a glass cloth impregnated with a resin.

In the first upper insulating layer 114 disposed on the second insulating layer 113, via openings (first upper via openings) 119 are formed and connected to the extraction pattern 118. The via openings 119 are filled with a conductor 120 (may also be referred as upper vias, upper via hole conductor structure, or upper via contact) such as copper or the like. In the second upper insulating layer 115 laminated on the first upper insulating layer 114, via openings (second upper via openings) 121 are formed and connected to the via openings 119. The via openings 121 are filled with a conductor 122 (also referred as vias, via hole conductor structure, or via contact) such as copper or the like. Namely, the vias 120, 122 (may also be referred as upper vias) form filled built-up vias.

Furthermore, a conductor pattern (circuit pattern) 123 is appropriately formed on the second upper insulating layer 115. The vias 120 are appropriately connected to the conductor pattern 123.

The constitution of the connection portion between the rigid board 12 and the flexible board 13 is similar to that of the connection portion between the rigid board 11 and the flexible board 13.

In the flex-rigid wiring board 10 having the above constitution, the end of the flexible board 13 is held between the first and second insulating layers 111, 113 which constitute the core portion of the rigid board 11 and subjected to resin polymerization.

Furthermore, the connection pads (13b) of the conductor layer 133 of the flexible board 13 are connected to the conductor pattern 123 of the rigid board 11 through the vias or copper plating layers 117 formed in the via openings 116 which are formed in the second insulating layer 113 and the insulating film 135.

Therefore, when the flexible board 13 is bent, stress applied to the flexible board 13 is not transmitted to the connection portion (the via openings 116 and the vias 117) of the rigid board 11. Thus, stress applied to the connection portion between the rigid board 11 and the flexible board 13 is decreased and reliability is improved.

The conductor layer 133 of the flexible board 13 is connected by plating to the vias 117 in the via openings 116 of the rigid board 11. Therefore, the connection portion has high reliability.

The via openings 116 are filled with the resin of the upper insulating layer 114. Since the vias 117 are fixed and supported by the resin in the via openings 116, the connection reliability between the vias 117 and the conductor layer 133 is improved.

The end surfaces of the insulating layers 113, 111 which face the flexible board 13 project beyond the end of the upper insulating layer 114 which faces the flexible board 13. Therefore, when the flexible board 13 is bent, stress applied to the flexible board 13 is not transmitted to the connection portion (the via openings 116 and the vias 117) of the rigid board 11. Thus, stress applied to the connection portion between the rigid board 11 and the flexible board 13 is decreased and reliability is improved.

The horizontal extension and contraction of the extensible flexible board 13 is suppressed by the core portion of the rigid board 11. Therefore, bending reliability and heat resistance reliability are high. Also, the flexible substrate portion of the flexible board 13 is exposed between the rigid boards 11, 12, and thus bending stress applied to wiring is small as compared with a case in which the whole is covered with an insulating resin or the like.

In the flex-rigid wiring board 10, an end portion of the flexible board 13 is held between the first and second insulating layers 111, 113 of the rigid board 11. Therefore, a change in dimensions of the flexible board 13 has small influence, and a positional error of the connection lands (the vias 117) of the rigid board 11 is deceased. Thus, the via openings 116 having a smaller diameter may be designed.

The flexible board 13 is not disposed in the rigid boards 11, 12. Therefore, a degree of reliability similar to that of a conventional rigid board is maintained. In addition, there is high resistance to a plating solution and a general-purpose plating solution may be used. Similarly, since a flex material is not used in a rigid portion, the same heat resistance as a usual rigid portion can be maintained.

Furthermore, the flexible board 13 is partially used and effectively disposed, thereby suppressing the manufacturing cost.

Each of the upper insulating layers 114, 115 may be formed from usual prepreg. Usual prepreg is excellent in compatibility between inner layer patterns, and thus insulation deterioration due to the occurrence of voids or the like is avoided. In addition, a fine pattern, for example, a pattern with L/S of 60/50 or 50/50 μm, is realized. This can be achieved with a limitation on material control.

Furthermore, a general-purpose interlayer material (prepreg) may be used as each of the upper insulating layers 114, 115. Therefore, in the manufacturing process, IVH (Interstitial Via Hole) including the via openings 116 is filled with the resin constituting the upper insulating layers 114, 115. Thus, a resin exclusively used for filling in holes need not be used.

When a glass epoxy substrate is used as the core portion of each of the rigid boards 11, 12, dropping impact resistance is improved.

In this embodiment, a conductor pattern is formed only on the upper surface of each of the rigid boards 11, 12 for easier understanding. However, the present invention is not limited to such an example. For example, as shown in FIG. 3, a conductor pattern may be formed on the lower surface of each of the rigid boards 11, 12.

Figure 3:
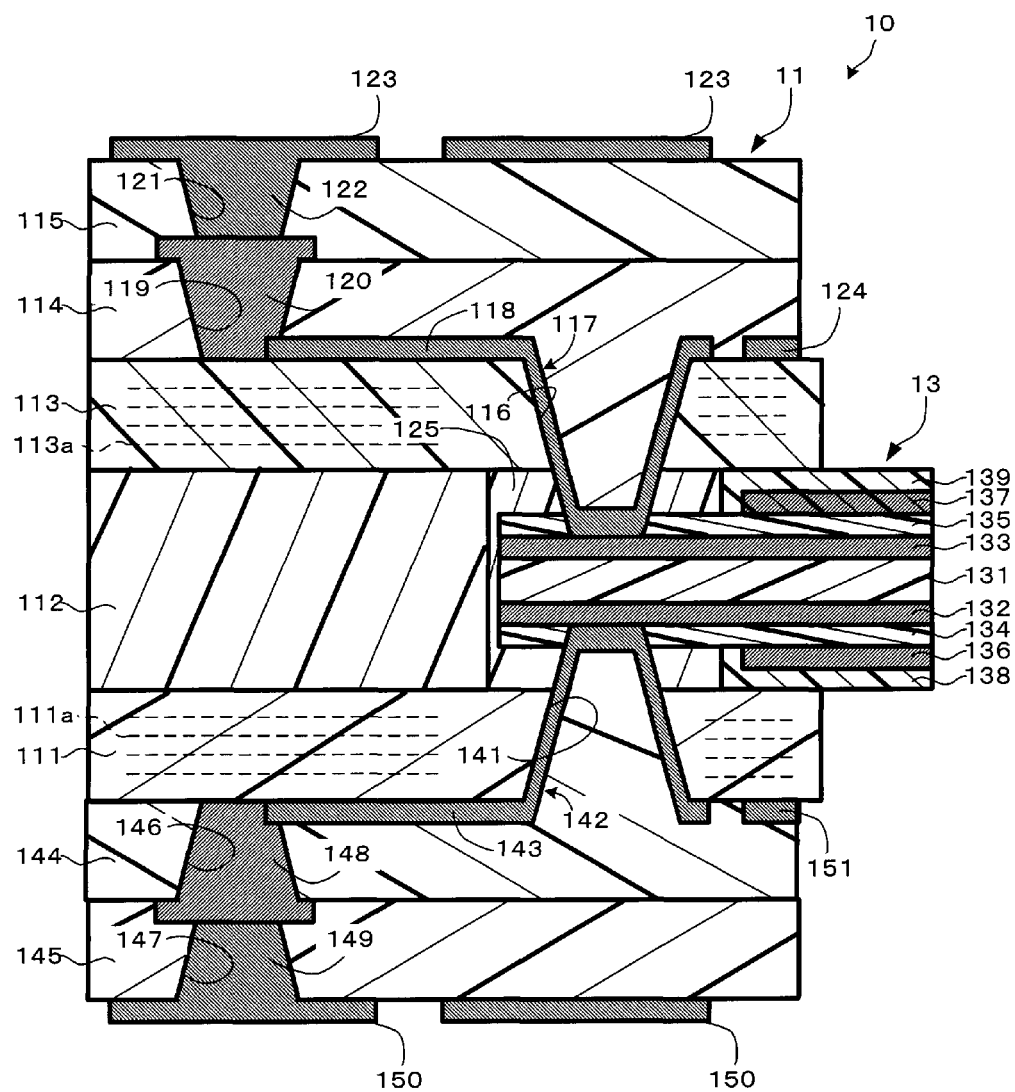
FIG. 3 is a view showing a modified example of the flex-rigid wiring board shown in FIG. 2.

In the constitution shown in FIG. 3, vias 141 are formed in the first insulating layer 111 and the insulating film 134 of the flexible board 13. In each via 141, a conductor pattern 142 is formed and connected to an extraction pattern 143 formed on the first insulating layer 111. The conductor pattern 142 and the extraction pattern 143 are formed by patterning a copper plating layer.

Furthermore, third and fourth upper insulating layers 144, 145 are laminated on the first insulating layer 111. Via openings 146, 147 are formed in the third and fourth upper insulating layers 144, 145, respectively. The via openings 146, 147 are filled with conductors 148, 149 (also referred as vias, via hole conductor structure, or via contact), respectively. A conductor pattern 150 is formed on the prepreg 145.

Next, according to one embodiment of the present invention, a method of manufacturing the flex-rigid wiring board 10 having the above-descried construction is described.

First, a method for manufacturing the flexible board 13 will be described.

Copper films are formed on both surfaces of the polyimide substrate 131 processed into a predetermined size. Next, the copper films are patterned to form the conductor layers 132, 133 each having the wiring pattern (13*a*) and the connection pads (13*b*).

The insulating films 134, 135 each including a polyimide layer are formed on the polyimide substrate 131 and the conductor layers 132, 133, respectively. Furthermore, silver paste is applied except on the end of the flexible board 13, and the applied silver paste is cured to form the shield layers 136, 137.

Then, the cover lays 138, 139 are formed to cover the shield layers 136, 137 on the front and the back surfaces, respectively.

Figure 4:
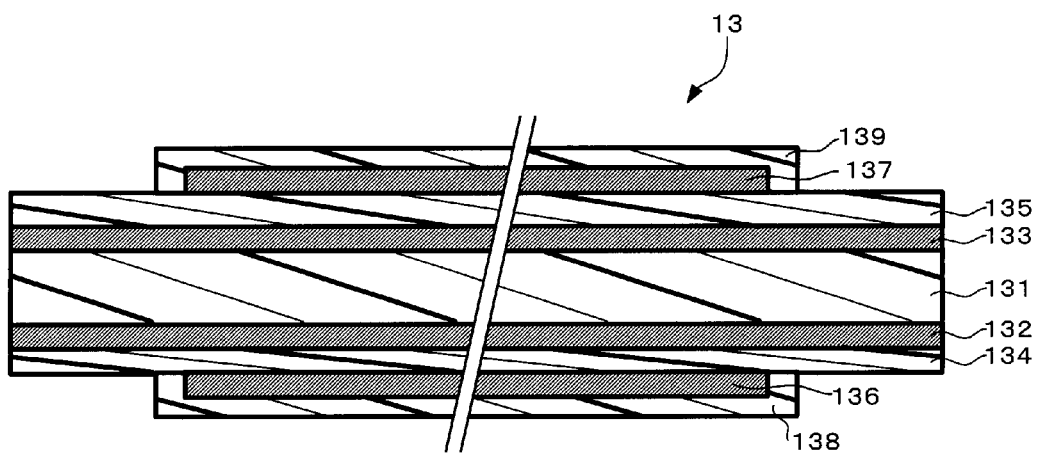
FIG. 4 is a side view of a flexible board.

As a result, the flexible board 13 having the constitution shown in FIG. 4 is completed. The shield layers 136, 137 and the cover lays 138, 139 are formed avoiding the connection pads (13*b*).

Next, a method of bonding the rigid boards 11, 12 and the flexible board 13 together is described.

Figure 5A:
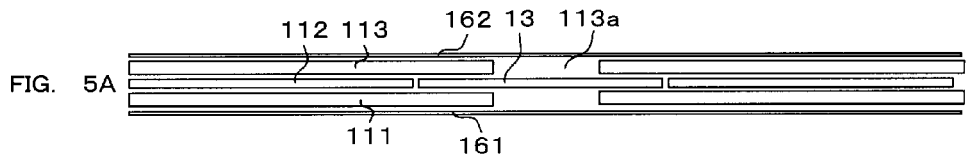
FIGS. 5A to 5L are views illustrating steps of a method of manufacturing a flex-rigid wiring board according to an embodiment of the invention.

First, as shown in FIG. 5A, the first insulating layer 111, the non-flexible substrate 112, and the second insulating layer 113, which constitute the core of the rigid board 11, are aligned. Each of the first and second insulating layers 111, 113 includes, for example, a prepreg having a thickness of 20 to 50 μm, and the non-flexible substrate 112 includes, for example, a glass epoxy substrate having a thickness of about 100 μm.

As shown in FIG. 2, the thickness of the non-flexible substrate 112 is preferably substantially the same as the thickness of the flexible board 13. In such a structure, the space between the non-flexible substrate 112 and the cover lay 139 is filled with the resin 125, and thus the flexible board 13 and the non-flexible substrate 112 are securely bonded together.

The resin 125 filled in the space is cured integrally with the insulating layer 113 to fix the peripheries of the vias 117 with the resin 125, thereby improving the reliability of connection between the vias 117 and the conductor layer 133.

Similarly, the non-flexible substrate and the first and second insulating layers constituting the core of the rigid board 12 are aligned.

Furthermore, one of the ends of the flexible board 13 is inserted between the first and second insulating layers 111, 113 of the rigid board 11 and aligned, and the other end is disposed between the first and second insulating layers and the non-flexible substrate of the rigid board 12. Furthermore, conductor films 161, 162 (also referred as "copper foils") are disposed on and below these layers. A separator may be provided on the flexible board 13 before conductor films 161, 162 is disposed on and below these layers.

Figure 5B:
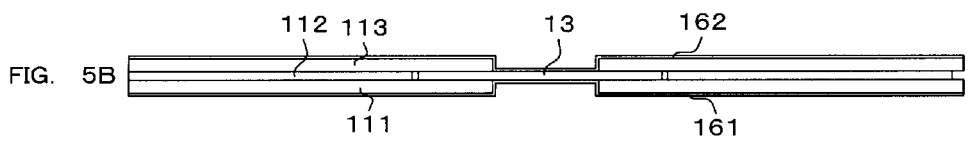
Figure 6A:
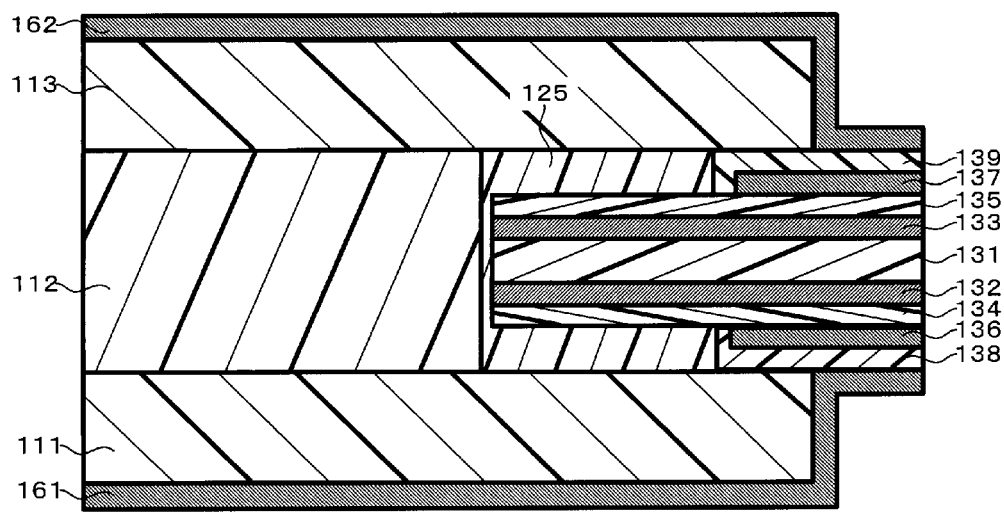
FIGS. 6A to 6F are enlarged views illustrating the method of manufacturing a flex-rigid wiring board shown in FIGS. 5A to 5L.

Next, as shown in FIG. 5B, these layers are pressed under pressure. At this time, as shown in an enlarged view of FIG. 6A, the spaces between the non-flexible substrate 112 and the flexible board 13 are filled with the resin 125 extruded from the prepreg constituting the first and second insulating layers 111, 113. Since the spaces are filled with the resin 125, the flexible board 13 and the non-flexible substrate 112 are securely bonded together.

The pressure pressing is performed, for example, using a hydropress apparatus at a temperature of 200° C. and a pressure of 40 kgf for a pressure time of about 3 hours.

Then, the whole is heated to cure the prepreg constituting the first and second insulating layers 111, 113 and the resin 125 and integrated. At the same time, the resin of the cover lays 138, 139 of the flexible board 13 and the resin of the first and second insulating layers 111, 113 are overlapped. The resin of the insulating layers 111, 113 is overlapped and fixes the peripheries of the vias 117, thereby improving the reliability of connection between the via 117 and the conductor layer 133.

Figure 5C:
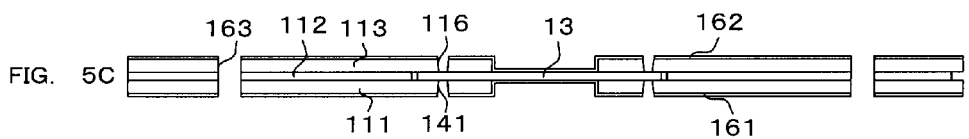
Figure 6B:
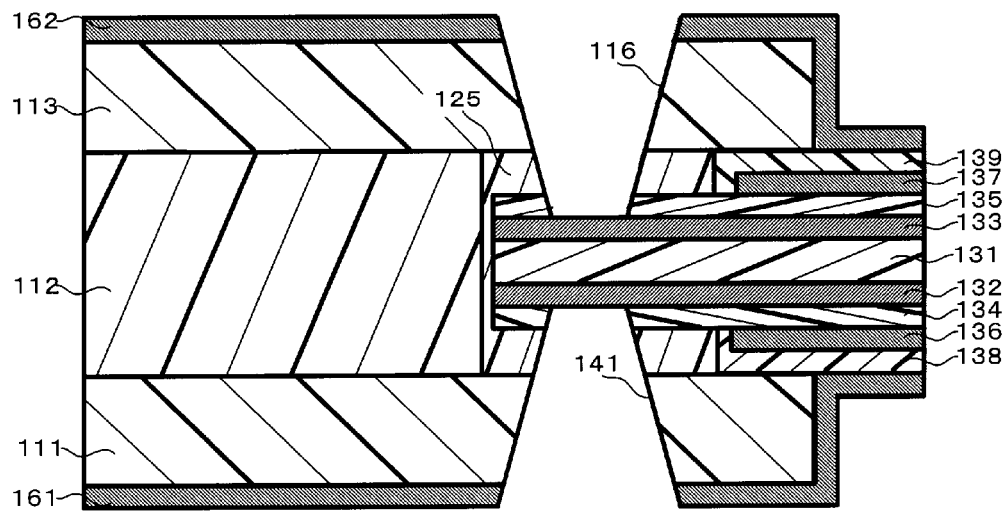

Next, as shown in FIG. 5C, IVH (Interstitial Via Hole) 163 is formed, for example, by irradiation of $CO_2$ laser from a $CO_2$ laser processing apparatus accordingly. At the same time, as shown in an enlarged view of FIG. 6B, the via openings 116, 141 are formed for connecting the wiring layers 132, 133 of the flexible board 13 to the rigid boards 11, 12.

Figure 5D:
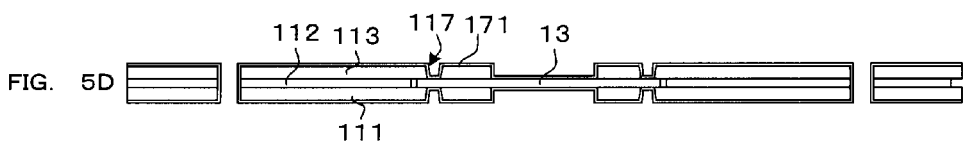
Figure 6C:
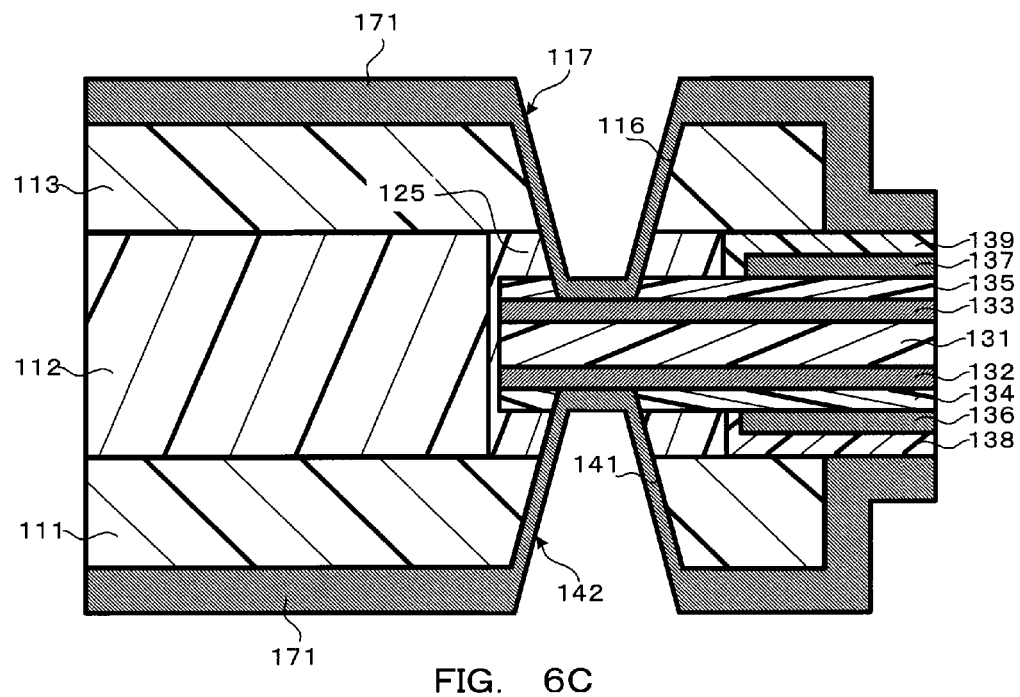

Then, as shown in FIG. 5D, copper plating is conducted on the surfaces of the whole structure. The copper plating layers and the copper patterns 161, 162 previously formed are integrated to form a copper film 171 over the entire surface of the board. As shown in FIG. 6C, the copper plating layer 117 is formed in the vias openings 116, 141. In the copper plating, the flexible board 13 is covered with the copper foils 161, 162 and does not make direct contact with a plating solution. Therefore, the flexible board 13 is not damaged by the plating solution.

Figure 5E:
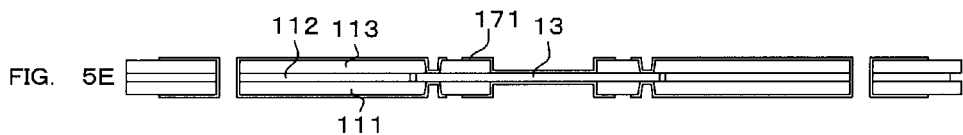
Figure 6D:
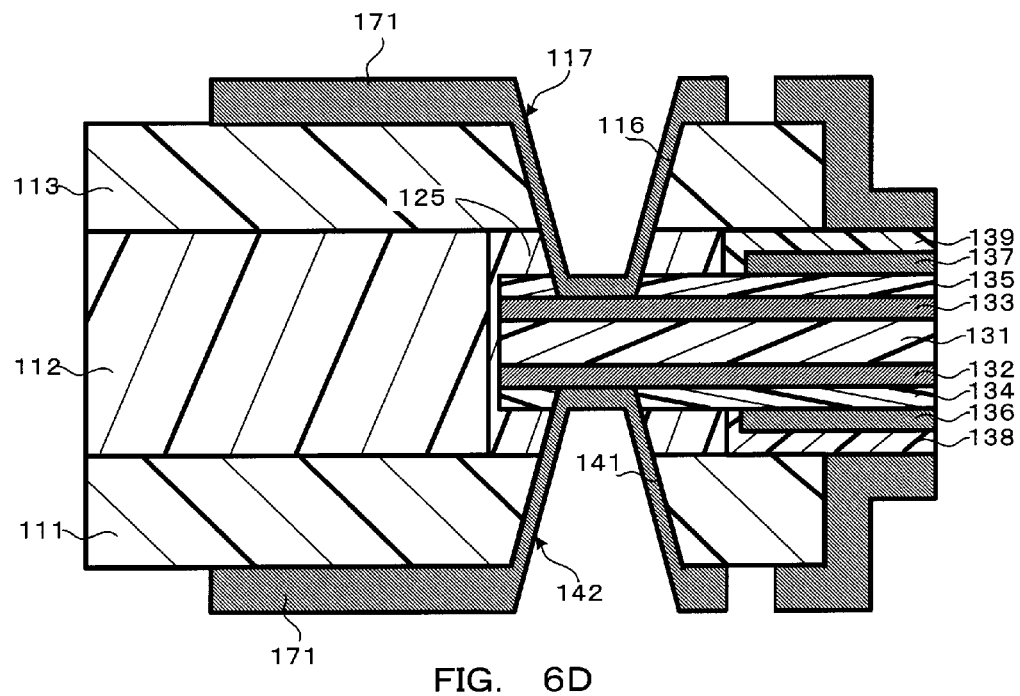

Then, as shown in FIG. 5E, the copper film 171 on the surface of the board is patterned. In this step, the vias 117, 142 connected to the conductor layers 132, 133 of the flexible board 13 and the extraction patterns 118, 143 are formed. At the same time, as shown in FIG. 6D, the copper film 171 is left on the end portions of the first and second insulating layers 111, 113.

Figure 5F:
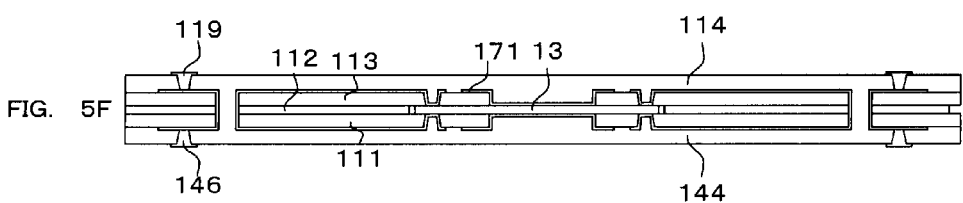

Then, as shown in FIG. 5F, the first and third upper insulating layers 114, 144 are disposed on and below the resulting structure. Each of the first and third upper insulating layers 114, 144 includes, for example, a prepreg prepared by impregnating a glass cloth with a resin. The via openings 116, 141 are filled with the resin from the prepreg.

Then, the resin in the prepreg and the vias is cured by heating to solidify the first and third upper insulating layers 114, 144. Next, the via openings 119, 146 are formed in the first and third upper insulating layers 114, 144, respectively, and filled with a conductor by copper plating or the like. The via openings 119, 146 may be filled with conductive paste (e.g., thermosetting resin containing conductive particles) by printing such as screen printing and then subjected to resin curing.

Figure 5G:
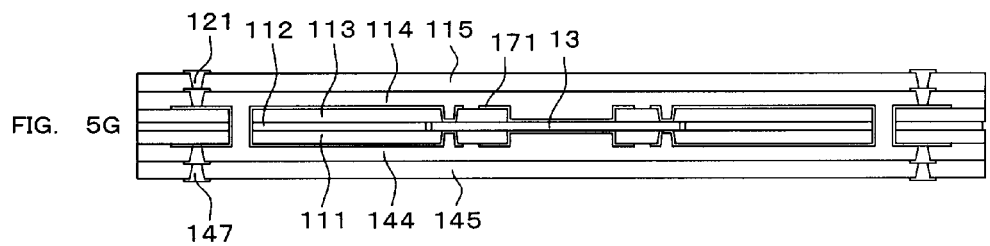

Then, as shown in FIG. 5G, the second and fourth upper insulating layers 115, 145 are disposed on and below the whole board. Each of the second and fourth upper insulating layers 115, 145 includes, for example, usual prepreg prepared by impregnating a glass cloth with a resin. Before the second and fourth upper insulating layers 115, 145 are formed, a separator may be disposed in an opening formed in the first and third upper insulating layers 114, 144.

Next, the resin of the prepreg is cured by heating to solidify the second and fourth upper insulating layers 115, 145.

Furthermore, the via openings 121, 147 are formed in the second and fourth upper insulating layers 115, 145, respectively, and filled with a conductor by copper plating. The via openings 121, 147 may be filled with conductive paste (e.g., thermosetting resin containing conductive particles) by printing such as screen printing and then subjected to resin curing. When the via openings 121, 147 are filled with the same conductive paste material, connection reliability of the vias 122, 149 (also referred as upper vias) against the thermal stress is improved.

Figure 5H:
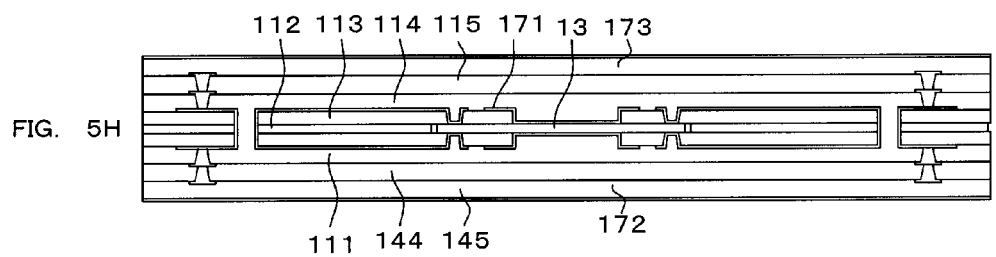

If required, as shown in FIG. 5H, copper foil sheets with resin (resin copper film: RCF) 172, 173 are disposed on the outermost layers of the board and pressed.

Then, the whole structure is heated to cure the resin.

Figure 5I:
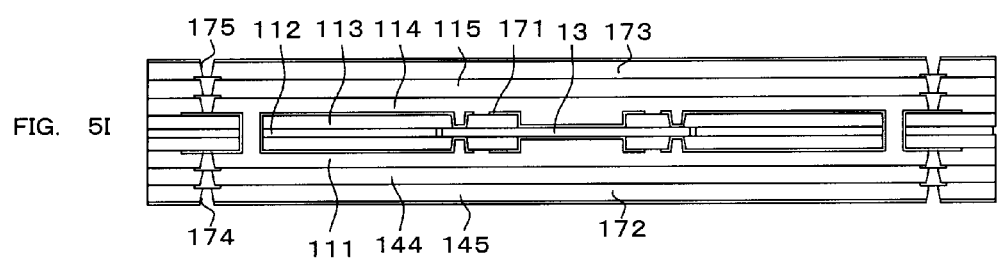

Next, as shown in FIG. 5I, via openings 174, 175 are formed in the RCFs 172, 173, respectively. Next, the via openings 174, 175 are filled with a conductor by copper plating. If required, the surface copper foils are patterned to form conductor patterns.

Figure 5J:
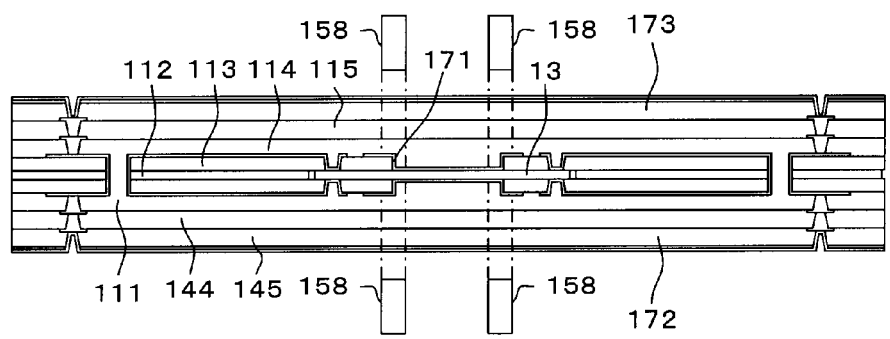
Figure 6E:
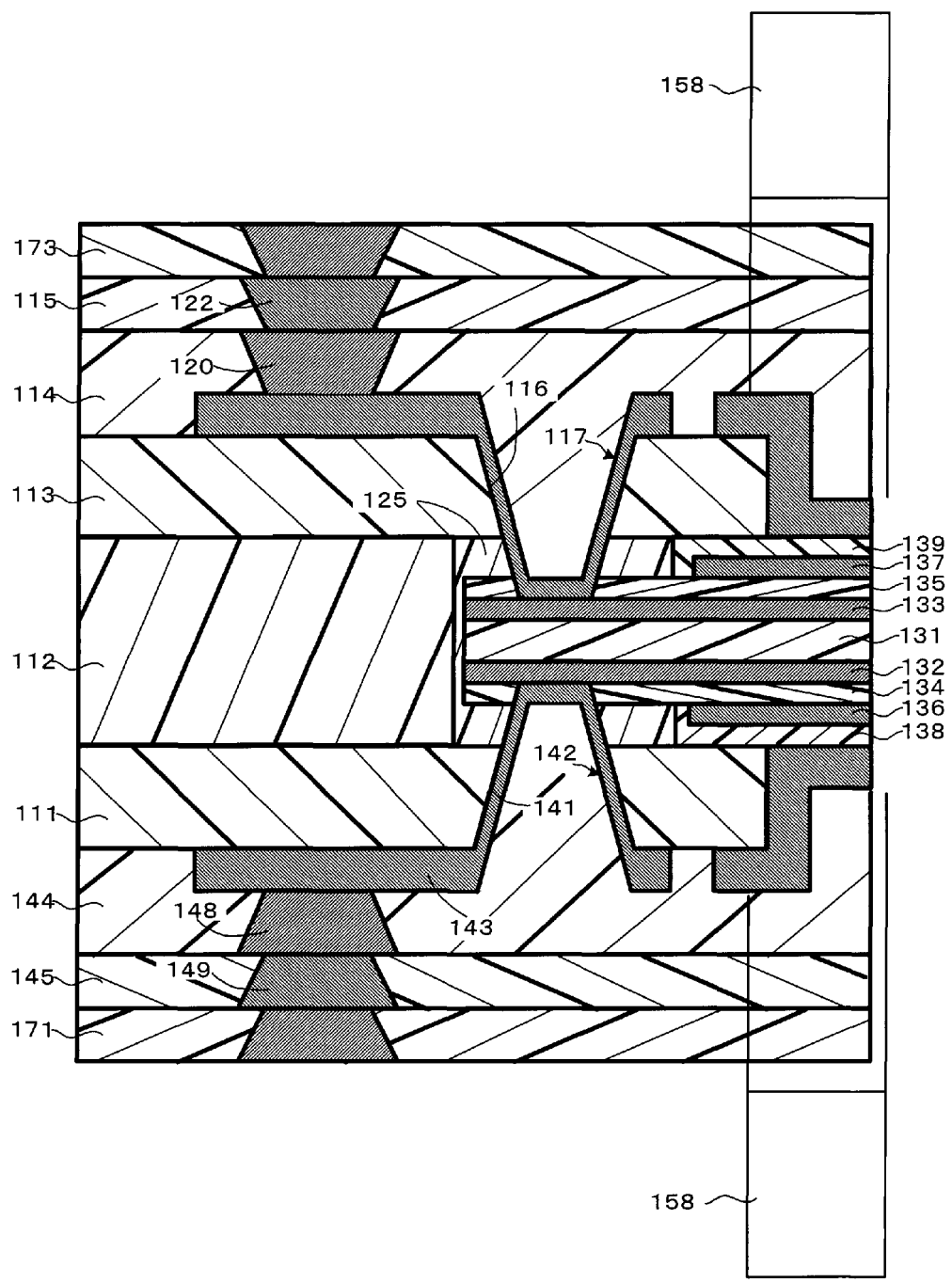
Figure 6F:
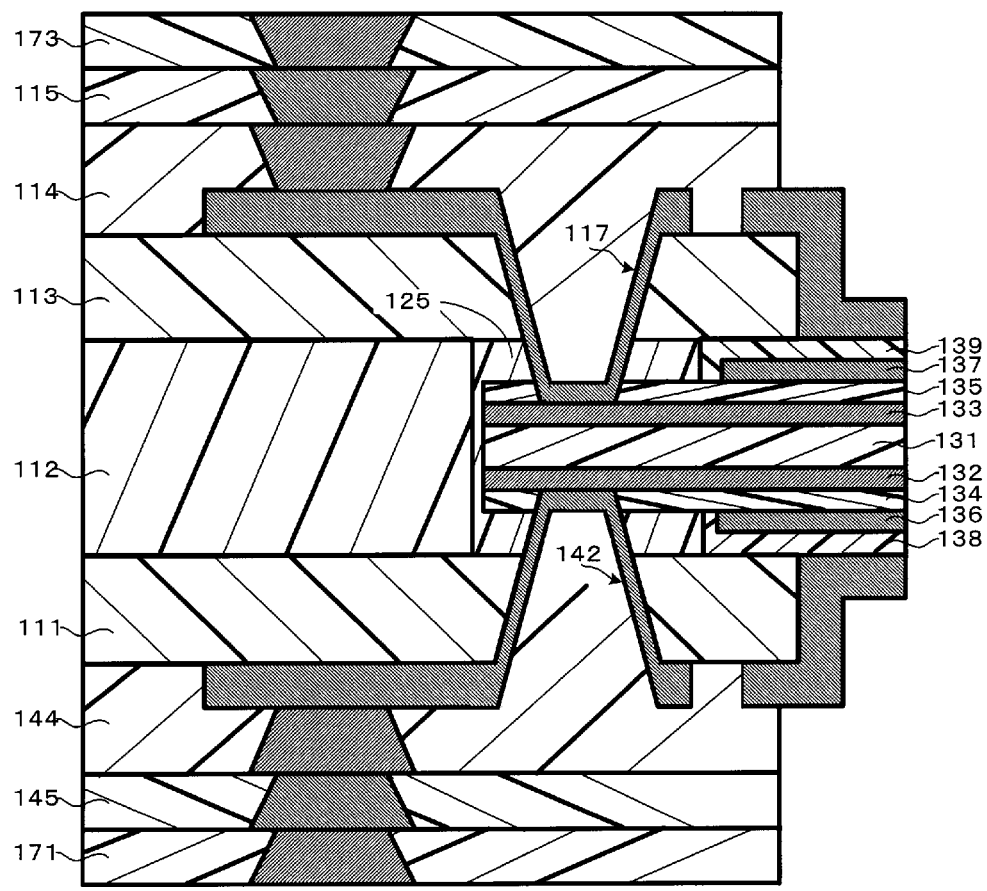

Next, as shown in FIGS. 5J and 6E, the joint portions between the rigid boards 11, 12 and the flexible board 13 are irradiated with laser beam 158, for example, $CO_2$ laser, using as a stopper the copper foil 171 formed at the ends of the cores of rigid boards 11, 12 to cut the upper insulating layers 114, 115, 144, 145, and the copper foil sheets with resin (RCFs) 172, 173. In this step, the energy or irradiation time is controlled such that the copper foil 171 used as a stopper is cut to some extent.

As a result, as shown in FIG. 5H, a structure 181 on the flexible board 13 is separated from the other portions.

Figure 5K:
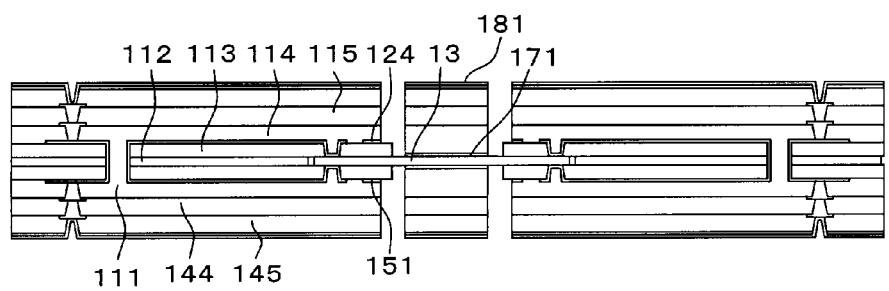
Figure 5L:
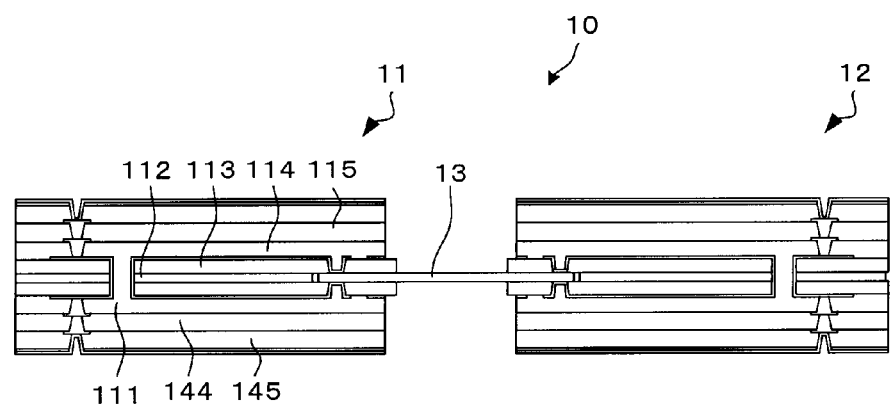
Figure 5A:
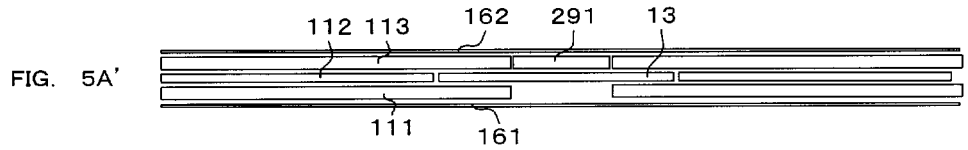
Figure 5G:
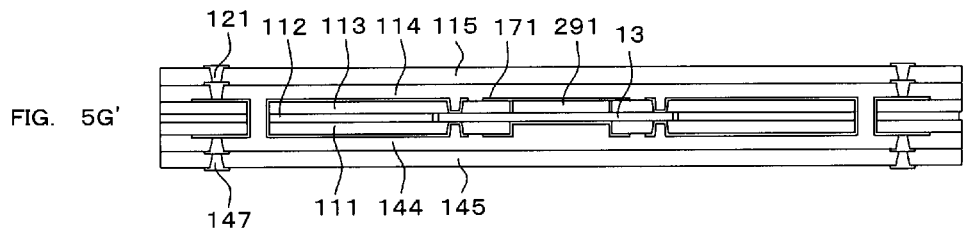
Figure 5K:
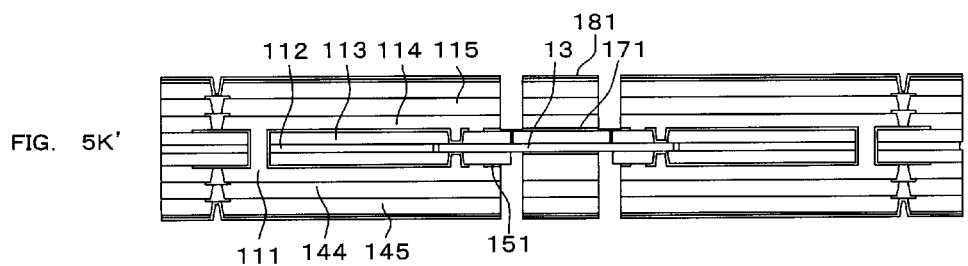
Figure 5L:
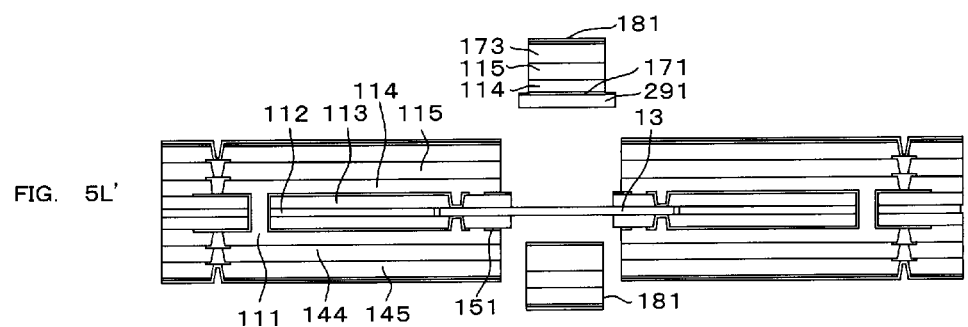

Then, as shown in FIG. 5L, the structure 181 is removed from the flexible board 13 by peeling. The copper foils 161, 162 (refer to FIG. 5B), which are a base of the remaining copper foil 171, are only pressed by the cover lays 138, 139 of the flexible board 13 and are not fixed. Similarly, the copper foil 171 is not fixed to the flexible board 13. Therefore, the copper foil 171 is also removed by removal of the structure 181.

Consequently, portions of the copper foil 171 not covered with the other components are removed. Therefore, the copper foils 124, 151 are left on portions covered with the prepregs 113, 144 at the ends of the first and second insulating layers 111, 113.

As a result, the flex-rigid wiring board 10, in which the ends of the flexible board 13 are held between the core portions (the first and second insulating layers 111, 113) of the rigid boards 11, 12, and the lands of the rigid boards 11, 12 are connected to the connection pads of the flexible board by plating, is completed.

In the above-described structure, plating on the polyimide of the flexible board 13 is not required, thereby securing connection reliability.

In addition, RCF can be used on the outermost layers of the rigid boards 11, 12. Therefore, similar reliability and dropping resistance as those of a conventional rigid board are secured.

In the manufacturing method, prepreg including a resin having a low flow property is used for forming the core layer of each of the rigid boards 11, 13. However, usual prepreg may be used for layers other than the core layers, and thus IVH filling is not required, and voids are seldom formed.

Furthermore, only a bending portion includes a flexible board, and thus stability is improved.

Furthermore, holes are formed in multiple layers by laser processing after the formation of outer layers, and thus the manufacturing cost can be suppressed.

Since holes are formed in multiple layers by laser processing after the formation of outer layers, opening accuracy of the flexible board is increased.

Since a glass epoxy substrate is used for the core portions of the rigid boards 11, 12, dropping impact resistance is improved.

A method for manufacturing the flex-rigid wiring board 10 is not limited to those steps referred in FIGS. 5A to 6L. For example, referring to FIG. 5A', a separator 291 may be provided in a gap (113a) formed in the second insulating layer 113. The separator 291 may be, for example, a cured prepreg or a polyimide film. Also, an adhesive may be provided between the separator 291 and the copper foil 171. In such a case, through the steps shown in FIGS. 5B to 5F, the copper film 171 and the upper insulating layers 114, 115 may be formed over the separator 291 as shown in FIG. 5G'. Subsequently, through the steps shown in FIGS. 5H to 5I, the copper film sheet with resin (Resin Copper Film or RCF) 173 is provided over the upper insulating layer 115, and the via opening 174 is formed and filled with conductive material. Then, the boundary between the upper insulating layer 113 and the separator 291 is cut by the laser beam 158, using the copper film 171 as a stopper. At this time, the energy or irradiation time of the laser beam 158 may be adjusted such that the copper film 171 is cut appropriately to some extent. As such, a structure 181 over the flexible board 13 is separated as shown in FIG. 5K'. Then, the structure 181 may be torn off and removed from the flexible board 13 as shown in FIG. 5L'. The separator 291 makes easier to tear off and remove the structure 181 from the flexible board 13. Also, the separator 291 supports the copper film 171 and prevents a plating solution from seeping into the gap (113a) between the flexible board 13 and the copper film 162 and the copper film 171 from being torn.

Also, referring to FIGS. 5F'', 5G'', 5K'' and 5L'', another method for manufacturing the flex-rigid wiring board 10 is described below as a modification from the steps shown in FIGS. 5A to 6L. In this modification, after the separator 291 is provided, the steps described in FIGS. 5B through 5F are carried out. Then, using a laser, a cut line 292 may be formed in a portion of the upper insulating layer 114 above the separator 291 as shown in FIG. 5F''. Thereafter, the upper insulating layer 115 is provided over the upper insulating layer 114. However, in the place of a portion of the upper insulating layer 115, a separator 293 having one edge portion reaching over the cut line 292 is provided as shown in FIG. 5G''. Subsequently, the resin bearing copper film sheet 173 is provided over the upper insulating layer and the separator 293 by carrying out the steps described in FIGS. 5H and 5I, a via opening is formed in the upper insulating layer 115, and copper plating is conducted. Then, using a laser, cut lines 294, 295 are formed over one edge portion of the separator 291 and over the other edge portion of the separator 293 as shown in FIG. 5K''. Finally, as shown in FIG. 5L'', a structure 296 defined by the cut line 294, the separator 291, the cut line 292, the separator 293 and the cut line 295 is removed. With such a structure, a portion or portions which do not contribute to the formation of circuitry may be removed and the volume of a wiring board may be reduced.

In the above, the modifications concerning the manufacturing steps related to the rigid board 12 are described. However, such modifications may be applied to the manufacturing steps of the rigid board 11 or both of the rigid boards 11, 12. Also, in the examples described above, the modifications describe the manufacturing steps concerning the upper portions of the flex-rigid wiring board 10. However, such modifications may be applied to the lower portions of the flex-rigid wiring board 10 or the flex-rigid wiring board 10 as a whole.

Although the flex-rigid wiring board 10 according to an embodiment of the present invention is descried above, the present invention is not limited to this embodiment. For example, the materials, sizes, and number of the layers may be appropriately changed.

Figure 7:
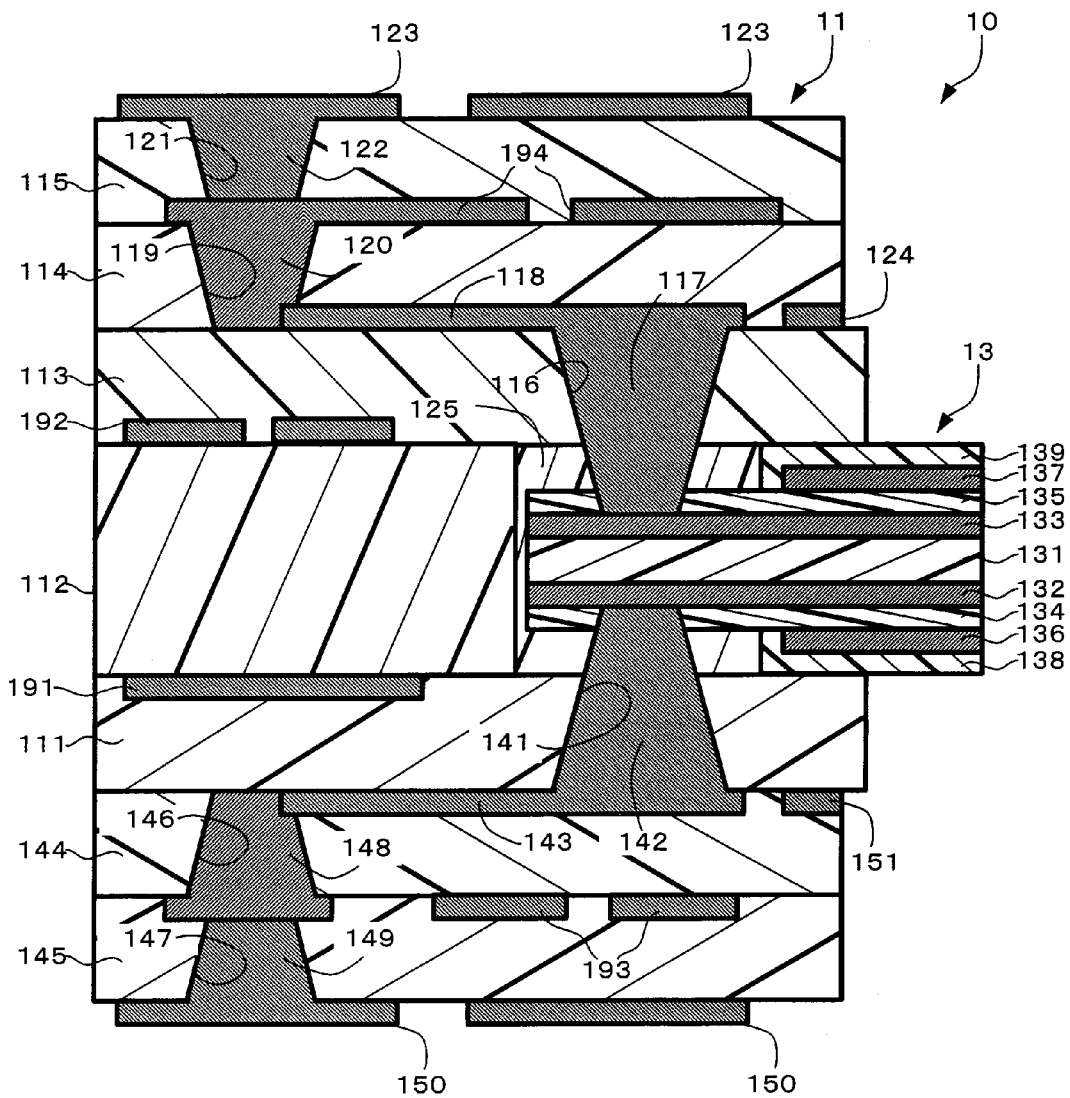
FIG. 7 is a view showing a modified example of the flex-rigid wiring board shown in FIG. 2.

As illustrated in FIG. 7, the via openings 116, 141 may be filled with a conductor such as a plating metal. When the via openings 116, 141 are not completely filled with the resin, voids are formed in the via openings 116, 141. In this case, when heat is applied to the flex-rigid wiring board 10, the connection reliability of the vias may be compromised due to the expansion of the voids. When the via openings 116, 141 are filled with a plating metal as shown in FIG. 7, the connection reliability of the vias 117, 142 against the heat can be improved.

Similarly, conductor patterns (circuit patterns) 191, 192 may be formed on the non-flexible substrate 112, for connection with any desired portion.

Also, conductor patterns (circuit patterns) 193, 194 may be formed on the first and third upper insulating layers 114, 144, for connection with any desired portion.

The conductor patterns 191, 143, 193, 150 are connected to each other through the vias 148, 149 and other vias. Similarly, the conductor patterns 192, 118, 194, 123 are connected to each other through the vias 120, 122 and other vias. Furthermore, the conductor patterns 123, 150 are connected to each other through the vias formed in the via openings 163.

The first and second insulating layers 111, 113 which hold the end of the flexible board 13 therebetween may be composed of RCF. Each of the first and third upper insulating layers 114, 144 and the second and fourth upper insulating layers 115, 145 may be composed of RCF. In this constitution, a manufacturing step can be omitted.

Figure 8:
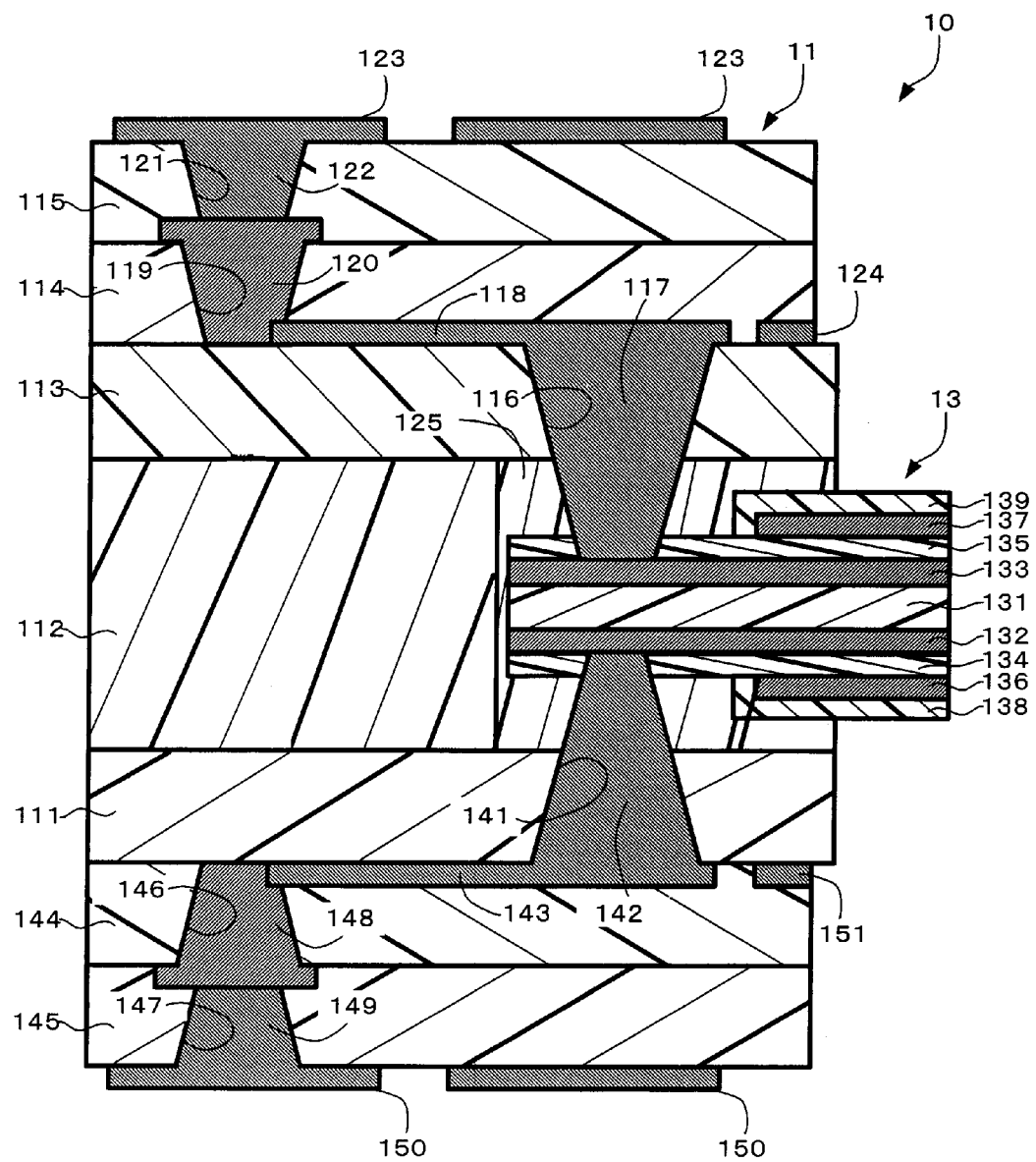
FIG. 8 is another view showing a modified example of the flex-rigid wiring board shown in FIG. 2.

Although, in this embodiment, the flexible board 13 and the non-flexible substrate 112 have substantially the same thickness, the present invention is not limited to such an example. For example, as shown in FIG. 8, the flexible board 13 may be thinner than the non-flexible substrate 112. In this case, the spaces between the flexible board 13, the non-flexible substrate 112, and the first and second insulating layers 111, 113 are filled with a resin, for example, the resin seeping from the insulating layers 111, 113 or a resin previously inserted for adjusting the height during manufacture. In this way, the spaces are filled with the resin 125, and thus the flexible board 13 and the non-flexible substrate 112 are securely bonded together.

The resin is integrally cured and solidified by heating during manufacture. Since the resins of the insulating layers 111, 113 are overlapped, and the resin 125 is integrally cured and solidified, the peripheries of the vias 117, 142 are fixed with the resin and the reliability of connection between the vias 117, 142 and the conductor layers 133, 132 is improved.

Figure 9:
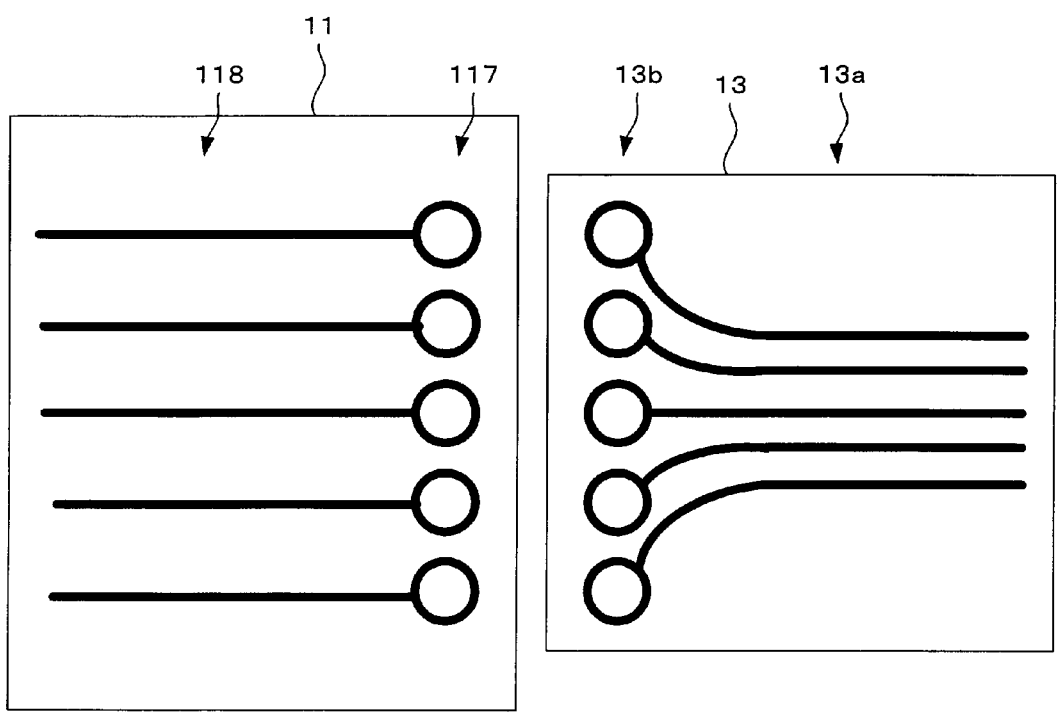
FIG. 9 is a view showing an example of fan-out of a wiring pattern.

In addition, the wiring patterns formed on the rigid boards 11, 12 and the flexible board 13 are not limited to the example shown in FIG. 1. For example, as illustrated in FIG. 9, the wiring patterns may be formed in a shape which fans out from the flexible board 13 toward the rigid boards 11, 12. Namely, the pitch of the connection portion (13b) may be made larger than that of wiring (13a) of the flexible board 13. In this case, more wirings are disposed on the flexible board 13, and thus a flex-rigid wiring board having high-density wiring may be formed.

Figure 10:
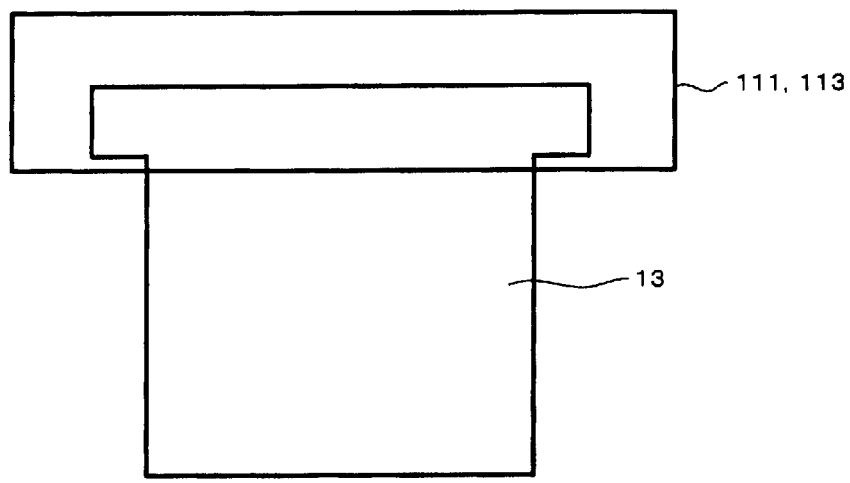
FIG. 10 is a view showing an example in which a flexible substrate is partially widened to increase strength.
Figure 11:
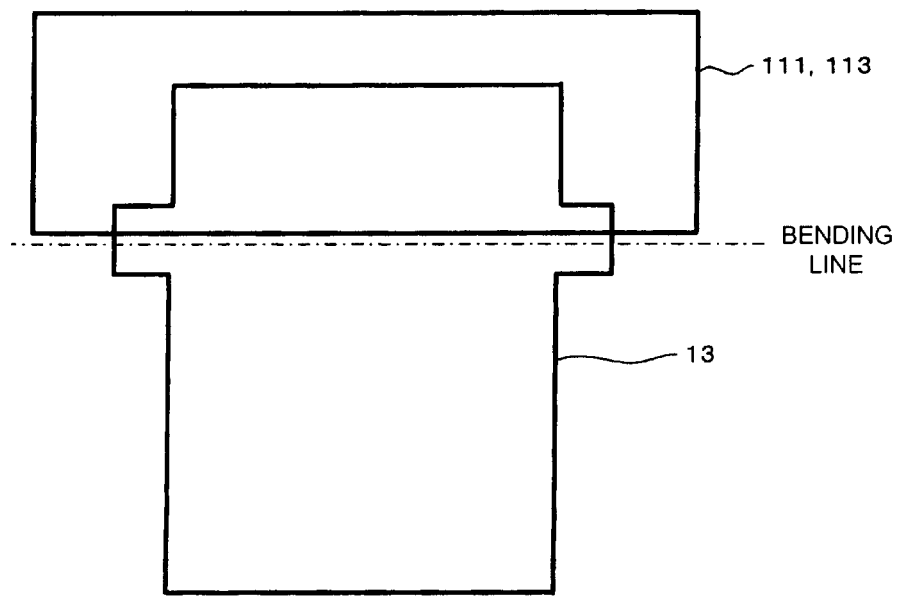
FIG. 11 is another view showing an example in which a flexible substrate is partially widened to increase strength.

In order to increase the strength of the boundary portions between the rigid boards 11, 12 and the flexible board 13, as illustrated in FIGS. 10 and 11, the flexible board 13 may be partially widened. In this case, the area of connection between the flexible board 13 and the rigid boards 11, 12 is increased, thereby improving the connection reliability of vias.

For example, in an example shown in FIG. 10, an end of the flexible board 13 is widened to increase the area of a portion to be fixed to each of the rigid boards 11, 12. In this case, the strength of the ends of the flexible board 13 is increased and bending resistance is improved.

In an example shown in FIG. 11, projections are formed at a position where bending of the flexible board 13 is to be repeated (for example, the position corresponding to the end surfaces of the rigid boards 11, 12) to increase the strength of the position where bending is repeated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A flex-rigid wiring board comprising:
    a flexible board comprising a flexible substrate and a conductor layer formed over the flexible substrate, the conductor layer including a conductor pattern;
    a non-flexible substrate disposed adjacent to the flexible board;
    an insulating layer covering the flexible board and the non-flexible substrate and exposing at least one portion of the flexible board;
    a conductor pattern formed on the insulating layer; and
    a plating layer directly connecting the conductor pattern of the flexible board and the conductor pattern on the insulating layer.

2. The flex-rigid wiring board according to claim 1, wherein the flexible board and the non-flexible substrate are disposed with a space therebetween, and the space is filled with a resin.

3. The flex-rigid wiring board according to claim 1, wherein the flexible board and the non-flexible substrate are disposed with a space therebetween, the space is filled with a resin, and the resin is cured integrally with the insulating layer.

4. The flex-rigid wiring board according to claim 1, further comprising a conductor pattern formed on a surface of the non-flexible substrate.

5. The flex-rigid wiring board according to claim 4, further comprising:
    a via formed in the insulating layer and connecting the conductor pattern on the insulating layer and the conductor pattern on the non-flexible substrate; and
    a second insulating layer covering the flexible board and the non-flexible substrate and exposing the at least one portion of the flexible board,
    wherein the insulating layer covers surfaces of the flexible board and the non-flexible substrate, and the second insulating layer covers surfaces of the flexible board and the non-flexible substrate on a second side opposite to the first side.

6. The flex-rigid wiring board according to claim 1, further comprising a second insulating layer covering the flexible board and the non-flexible substrate and exposing the at least one portion of the flexible board, wherein the insulating layer covers surfaces of the flexible board and the non-flexible substrate on a first side and the second insulating layer covers surfaces of the flexible board and the non-flexible substrate on a second side opposite to the first side.

7. The flex-rigid wiring board according to claim 1, further comprising:
    an upper insulating layer formed on the insulating layer;
    an upper conductor pattern formed on the upper insulating layer and including a cured resin layer comprising an inorganic material; and
    an upper via filled with a plating metal and connecting the conductor pattern on the insulating layer and the upper conductor pattern.

8. The flex-rigid wiring board according to claim 1, further comprising:
    a first upper insulating layer formed on the insulating layer;
    a first upper conductor pattern formed on the first upper insulating layer;
    a first upper via filled with a plating metal and connecting the conductor pattern on the insulating layer and the first upper conductor layer;

a second upper insulating layer formed on the first upper conductor pattern;

a second upper conductor pattern formed on the second upper insulating layer; and a second upper via filled with a plating metal, the second upper via being formed in a portion substantially directly above the first upper via and connecting the first and second upper conductor patterns.

9. The flex-rigid wiring board according to claim 1, further comprising:

an upper insulating layer formed on the insulating layer;

an upper via formed in the upper insulating layer and connected to the conductor pattern on the insulating layer; and a conductor pattern formed on the upper insulating layer and connected to the upper via.

10. The flex-rigid wiring board according to claim 9, wherein the upper insulating layer includes a glass cloth.

11. The flex-rigid wiring board according to claim 1, further comprising a copper foil sheet with resin laminated on the insulating layer, the copper foil sheet with resin being cured.

12. A flex-rigid wiring board comprising:

a flexible board comprising a flexible substrate and a conductor layer formed over the flexible substrate, the conductor layer including a conductor pattern;

a non-flexible substrate disposed adjacent to the flexible board;

an insulating layer covering the flexible board and the non-flexible substrate and exposing at least one portion of the flexible board;

a conductor pattern formed on the insulating layer; and a via formed in the insulating layer and directly connecting the conductor pattern on the insulating layer and the conductor pattern of the flexible board, wherein the via comprises a plating metal.

13. The flex-rigid wiring board according to claim 12, further comprising:

an upper insulating layer formed on the insulating layer;

an upper conductor pattern formed on the upper insulating layer; and an upper via formed in the upper insulating layer, the upper via being filled with a plating metal and connecting the conductor pattern on the insulating layer and the upper conductor pattern.

14. The flex-rigid wiring board according to claim 12, further comprising a resin layer comprising a resin and disposed on the insulating layer, wherein the via is filled with the resin of the resin layer.

15. The flex-rigid wiring board according to claim 12, wherein the via is filled with a metal.

16. The flex-rigid wiring board according to claim 12, further comprising:

an upper insulating layer formed over the insulating layer;

an upper conductor pattern formed on the upper insulating layer; and an upper via formed in the upper insulating layer and connecting the conductor pattern formed on the insulating layer and the upper conductor pattern, the upper via being connected to the via, wherein the via passes through the insulating layer and is filled with a plating metal.

17. The flex-rigid wiring board according to claim 12, wherein the conductor pattern on the insulating layer extends to an end portion of the insulating layer beyond a boundary between the flexible board and the non-flexible substrate.

18. The flex-rigid wiring board according to claim 12, further comprising:

an upper insulating layer formed on the insulating layer;

an upper conductor pattern formed on the upper insulating layer; and an upper via formed in the upper insulating layer and connecting the conductor pattern on the insulating layer and the upper conductor pattern, the upper via being filled with a conductive paste.

19. A flex-rigid wiring board comprising:

a flexible board comprising a flexible substrate and a conductor layer formed over the flexible substrate, the conductor layer including a conductor pattern;

a non-flexible substrate disposed adjacent to the flexible board;

an insulating layer covering the flexible board and the non-flexible substrate and exposing at least one portion of the flexible board;

a conductor pattern formed on the insulating layer; and a via formed in the insulating layer and directly connecting the conductor pattern on the insulating layer and the conductor pattern of the flexible board, wherein the flexible board further comprises a protective layer covering the conductor pattern of the flexible board, and the via formed in the insulating layer comprises a plating layer.

20. The flex-rigid wiring board according to claim 19, wherein the flexible board further comprises an insulating film formed between the conductor pattern and the protective layer of the flexible board, the via is formed to pass through the insulating film of the flexible board, the protective layer is provided in a region without the via, and a space between the non-flexible substrate and the protective layer and a periphery of the via is filled with a resin.

21. The flex-rigid wiring board according to claim 19, wherein the flexible board is thinner than the non-flexible substrate.

22. The flex-rigid wiring board according to claim 19, wherein the flexible board has a portion that the flexible board and the insulating layer are overlapped and a portion that the flexible board and the insulating layer are not overlapped, and the portion that the flexible board and the insulating layer are overlapped is wider than the portion that the flexible board and the insulating layer are not overlapped.

23. The flex-rigid wiring board according to claim 19, wherein the flexible board and the insulating layer form a boundary which is wider than other portions of the flexible board.

24. The flex-rigid wiring board according to claim 19, wherein the protective layer of the flexible board includes a shield layer which shields an electromagnetic wave.

* * * * *